United States Patent
Pagaila et al.

(10) Patent No.: US 8,883,559 B2
(45) Date of Patent: *Nov. 11, 2014

(54) SEMICONDUCTOR DEVICE AND METHOD OF FORMING ADHESIVE MATERIAL TO SECURE SEMICONDUCTOR DIE TO CARRIER IN WLCSP

(75) Inventors: Reza A. Pagaila, Singapore (SG); Yaojian Lin, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 614 days.

This patent is subject to a terminal disclaimer.

(21) Appl. No.: 12/567,033

(22) Filed: Sep. 25, 2009

(65) Prior Publication Data

US 2011/0074014 A1    Mar. 31, 2011

(51) Int. Cl.
*H01L 21/44*    (2006.01)
*H01L 23/00*    (2006.01)
*H01L 21/56*    (2006.01)
*H01L 23/31*    (2006.01)
*H01L 23/538*   (2006.01)
*H01L 21/683*   (2006.01)

(52) U.S. Cl.
CPC ............ *H01L 21/6835* (2013.01); *H01L 24/97* (2013.01); *H01L 2924/01322* (2013.01); *H01L*

(Continued)

(58) Field of Classification Search
CPC ........... H01L 2924/01078–2924/01079; H01L 2924/01029; H01L 2924/01013; H01L 2924/14
USPC .................. 438/106–109, 112–113, 127, 613; 257/E21.502
See application file for complete search history.

(56) References Cited

U.S. PATENT DOCUMENTS 5,250,843 A    10/1993  Eichelberger
5,353,498 A    10/1994  Fillion et al.

(Continued)

*Primary Examiner* — Hoa B Trinh
(74) *Attorney, Agent, or Firm* — Robert D. Atkins; Atkins and Associates, P.C.

(57) ABSTRACT

A semiconductor device is made by providing a temporary carrier and providing a semiconductor die having a plurality of bumps formed on its active surface. An adhesive material is deposited as a plurality of islands or bumps on the carrier or active surface of the semiconductor die. The adhesive layer can also be deposited as a continuous layer over the carrier or active surface of the die. The semiconductor die is mounted to the carrier. An encapsulant is deposited over the die and carrier. The adhesive material holds the semiconductor die in place to the carrier while depositing the encapsulant. An interconnect structure is formed over the active surface of the die. The interconnect structure is electrically connected to the bumps of the semiconductor die. The adhesive material can be removed prior to forming the interconnect structure, or the interconnect structure can be formed over the adhesive material.

26 Claims, 13 Drawing Sheets

(52) U.S. Cl.
CPC ............ *2924/14* (2013.01); *H01L 2924/09701* (2013.01); *H01L 2924/19041* (2013.01); H01L 21/565 (2013.01); H01L 23/3128 (2013.01); *H01L 2224/73265* (2013.01); *H01L 2924/01029* (2013.01); *H01L 2924/30105* (2013.01); *H01L 2224/20* (2013.01); *H01L 2224/16* (2013.01); *H01L 2924/01004* (2013.01); *H01L 2224/04105* (2013.01); *H01L 2924/014* (2013.01); *H01L 2924/0105* (2013.01); H01L 24/81 (2013.01); H01L 21/568 (2013.01); *H01L 2224/97* (2013.01); *H01L 2924/01082* (2013.01); *H01L 2924/15174* (2013.01); *H01L 2924/01079* (2013.01); *H01L 2924/15311* (2013.01); H01L 23/5389 (2013.01); *H01L 2924/12041* (2013.01); *H01L 2924/01047* (2013.01); *H01L 2924/01013* (2013.01); *H01L 2924/01049* (2013.01); *H01L 2924/13091* (2013.01); H01L 23/3114 (2013.01); H01L 24/19 (2013.01); H01L 21/561 (2013.01); *H01L 2924/01078* (2013.01); *H01L 2224/12105* (2013.01); *H01L 2924/1433* (2013.01); *H01L 2224/81801* (2013.01); *H01L 2924/01073* (2013.01)
USPC ....................................................... 438/106

(56) References Cited

U.S. PATENT DOCUMENTS

| | | | |
|---|---|---|---|
| 5,841,193 | A | 11/1998 | Eichelberger |
| 6,867,471 | B2 | 3/2005 | Goller et al. |
| 7,619,901 | B2 | 11/2009 | Eichelberger et al. |
| 7,767,496 | B2 * | 8/2010 | Shim et al. ................. 438/118 |
| 2004/0212088 | A1 * | 10/2004 | Chen et al. ................. 257/738 |
| 2006/0255474 | A1 | 11/2006 | Ahmad et al. |
| 2008/0138935 | A1 | 6/2008 | Pu et al. |
| 2009/0039496 | A1 | 2/2009 | Beer et al. |
| 2009/0152715 | A1 | 6/2009 | Shim et al. |
| 2009/0309212 | A1 | 12/2009 | Shim et al. |
| 2010/0133682 | A1 * | 6/2010 | Meyer ........................ 257/698 |
| 2011/0049695 | A1 | 3/2011 | Shin et al. |

\* cited by examiner

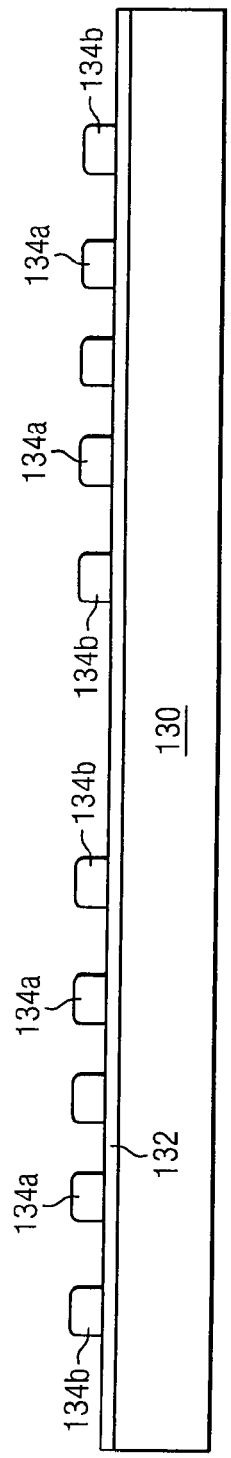
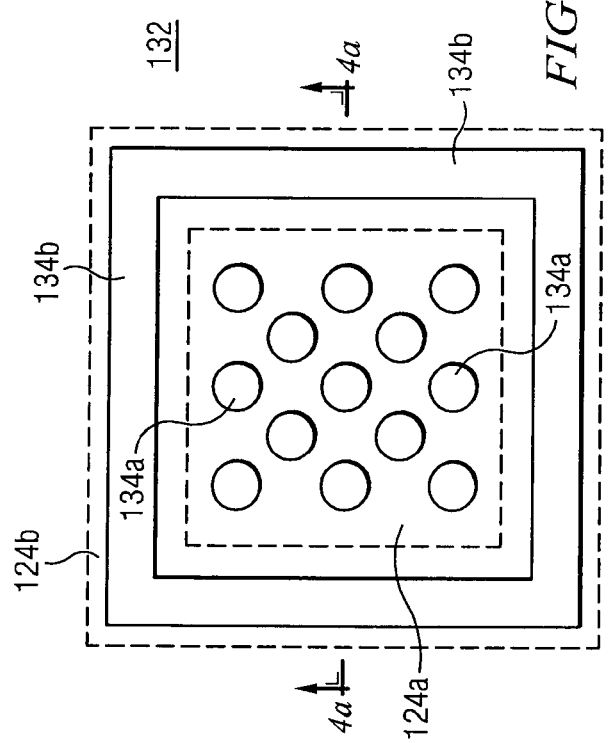

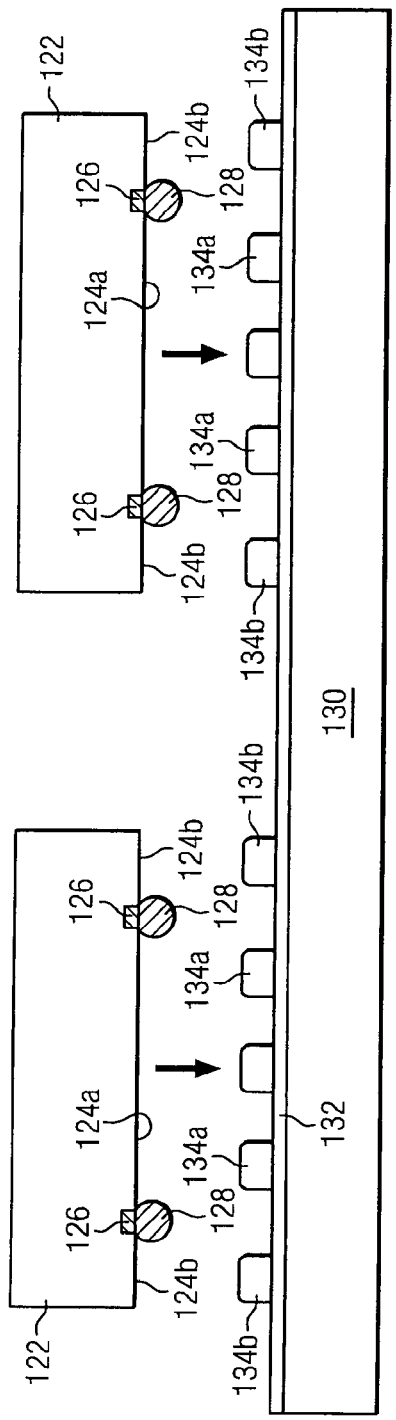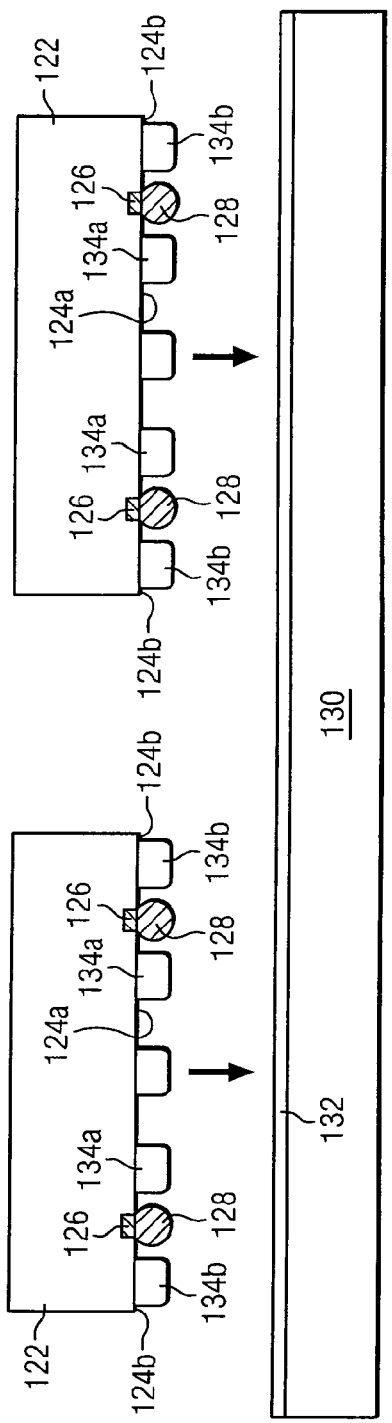

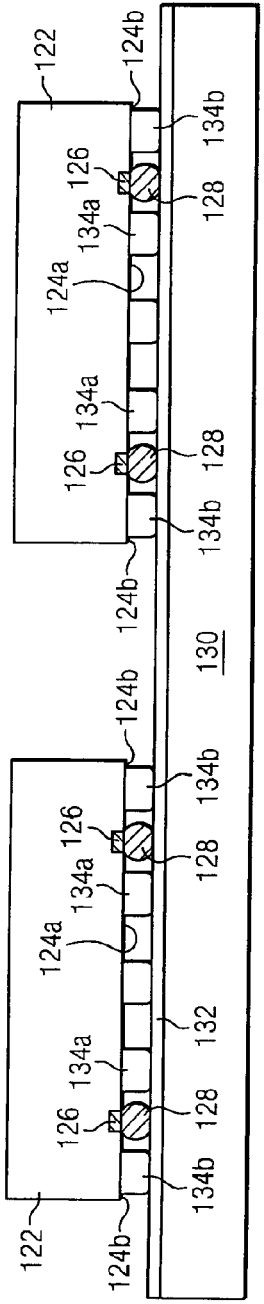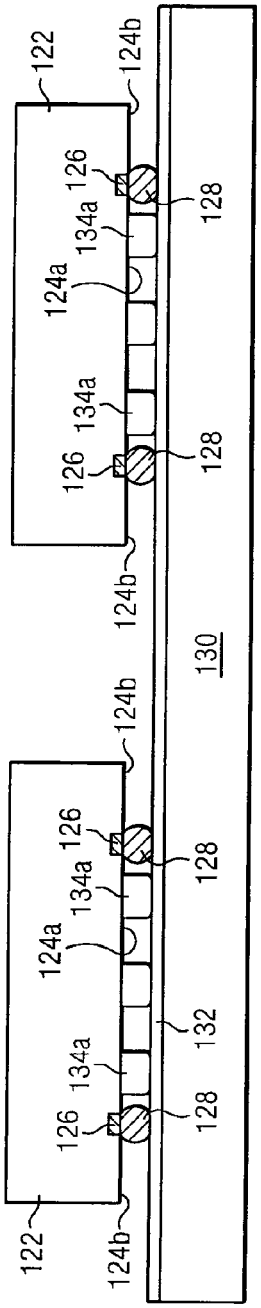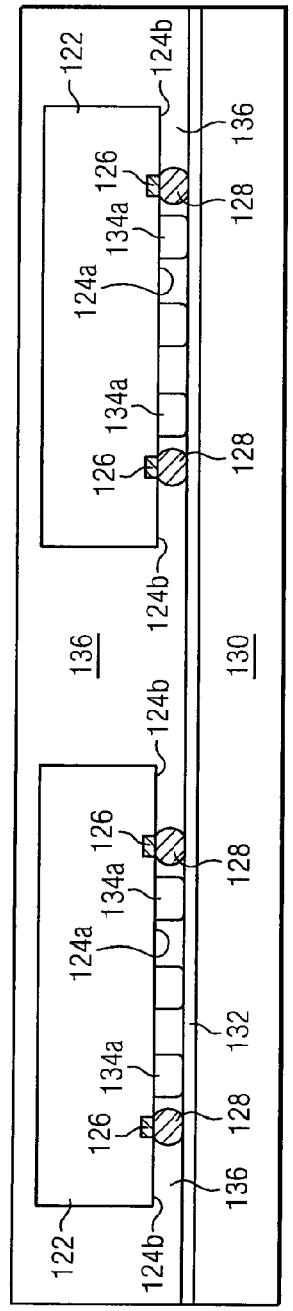
FIG. 5c
FIG. 5d
FIG. 5e

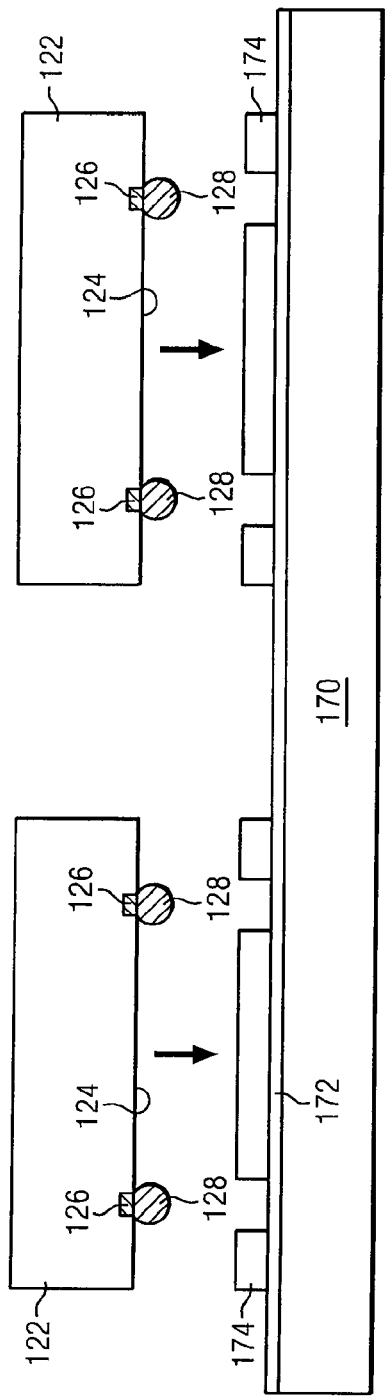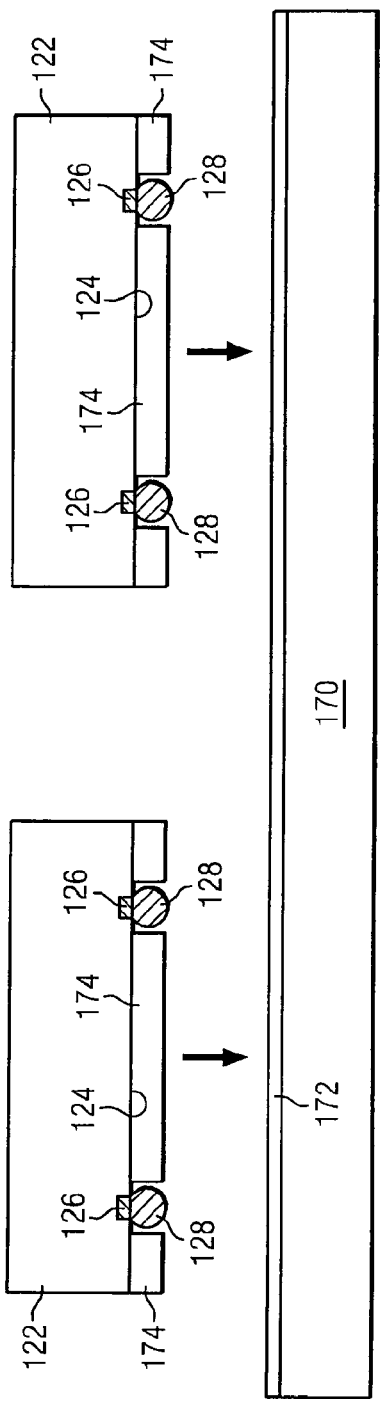

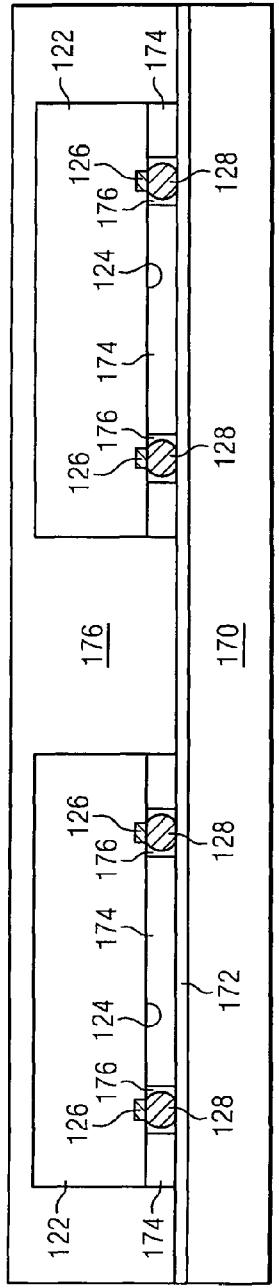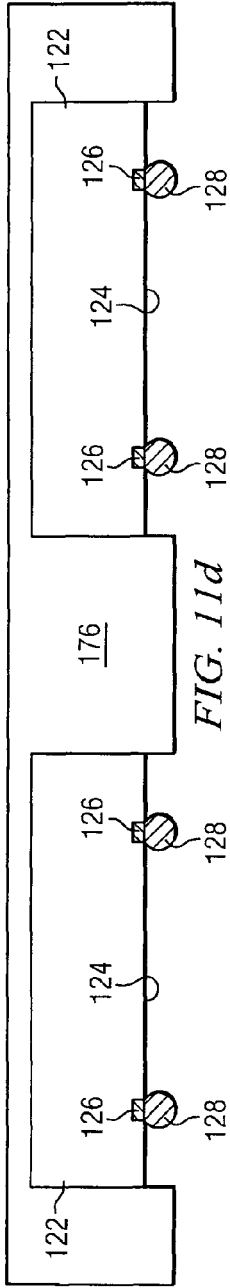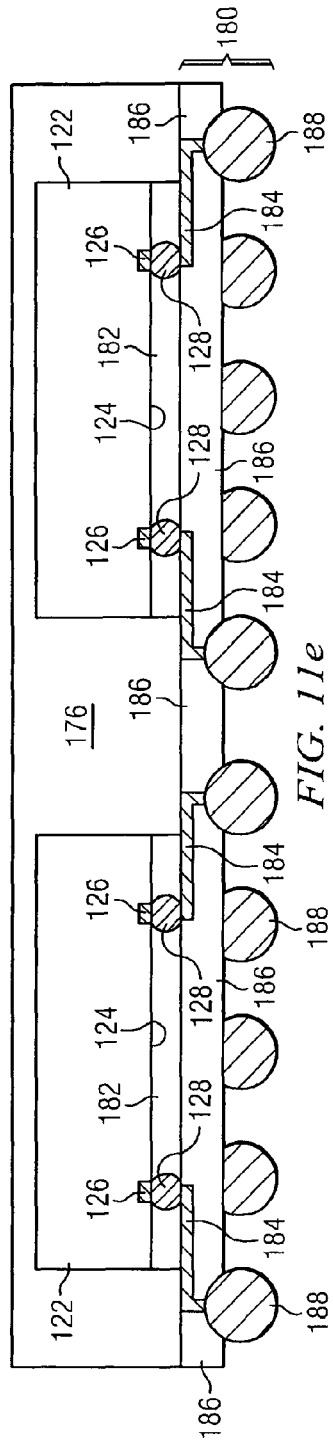

SEMICONDUCTOR DEVICE AND METHOD OF FORMING ADHESIVE MATERIAL TO SECURE SEMICONDUCTOR DIE TO CARRIER IN WLCSP

FIELD OF THE INVENTION

The present invention relates in general to semiconductor devices and, more particularly, to a semiconductor device and method of forming adhesive material to secure a semiconductor die to a temporary carrier during manufacture of a wafer level chip scale package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a wafer level chip scale package (WLCSP), a bumped semiconductor die can be attached to a temporary carrier to protect bond pads from contamination during via formation on a build-up interconnect layer, as described in U.S. Pat. No. 6,867,471. However, there is little or no adhesion between the bumps and carrier tape allowing the die to shift during encapsulation. Bump pads can be formed on the temporary carrier prior to die attachment to aid with adhesion between the die and carrier, as described in US patent publication 20080138935. Attaching the die bumps to bump pads on the carrier requires thermo-compression bonding which adds considerable time and cost to the manufacturing process. In addition, the bump pads on the carrier increase resistance between the bumps and other interconnects which limits the operating speed of the device.

SUMMARY OF THE INVENTION

A need exists to secure a semiconductor die to a temporary carrier to avoid die shifting during encapsulation. Accordingly, in one embodiment, the present invention is a method of making a semiconductor device comprising the steps of providing a temporary carrier, providing a semiconductor die having a plurality of bumps formed on its active surface, depositing an adhesive material as a plurality of islands or bumps over the temporary carrier or active surface of the semiconductor die, mounting the semiconductor die to the temporary carrier, and depositing an encapsulant over the semiconductor die and temporary carrier. The adhesive material holds the semiconductor die in place to the temporary carrier while depositing the encapsulant. The method further includes the steps of removing the temporary carrier, and forming an interconnect structure over the active surface of the semiconductor die. The interconnect structure is electrically connected to the bumps of the semiconductor die.

In another embodiment, the present invention is a method of making a semiconductor device comprising the steps of providing a carrier, providing a semiconductor component, depositing an adhesive material as a plurality of islands or bumps over the carrier or active surface of the semiconductor component, mounting the semiconductor component to the carrier, and depositing an encapsulant over the semiconductor component and carrier. The adhesive material holds the semiconductor component in place to the temporary carrier while depositing the encapsulant. The method further includes the steps of removing the carrier, and forming an interconnect structure over the active surface of the semiconductor component.

In another embodiment, the present invention is a method of making a semiconductor device comprising the steps of providing a carrier, providing a semiconductor component, depositing an adhesive material on the carrier or semiconductor component, mounting the semiconductor component to the carrier, depositing an encapsulant over the semiconductor component and carrier, removing the carrier, and forming an interconnect structure over the semiconductor component.

In another embodiment, the present invention is a semiconductor device made by a process comprising the steps of providing a carrier, providing a semiconductor component, depositing an adhesive material on the carrier or semiconductor component, mounting the semiconductor component to the carrier, depositing an encapsulant over the semiconductor component and carrier, removing the carrier, and forming an interconnect structure over the semiconductor component.

BRIEF DESCRIPTION OF THE DRAWINGS

FIGS. 4a-4b illustrate a temporary carrier with adhesive material;

FIGS. 5a-5h illustrate a process of securing the bumped semiconductor die to the carrier with adhesive material;

FIGS. 11a-11g illustrate a process of forming a continuous layer of adhesive material to secure semiconductor die to carrier;

DETAILED DESCRIPTION OF THE DRAWINGS

Figure 1:
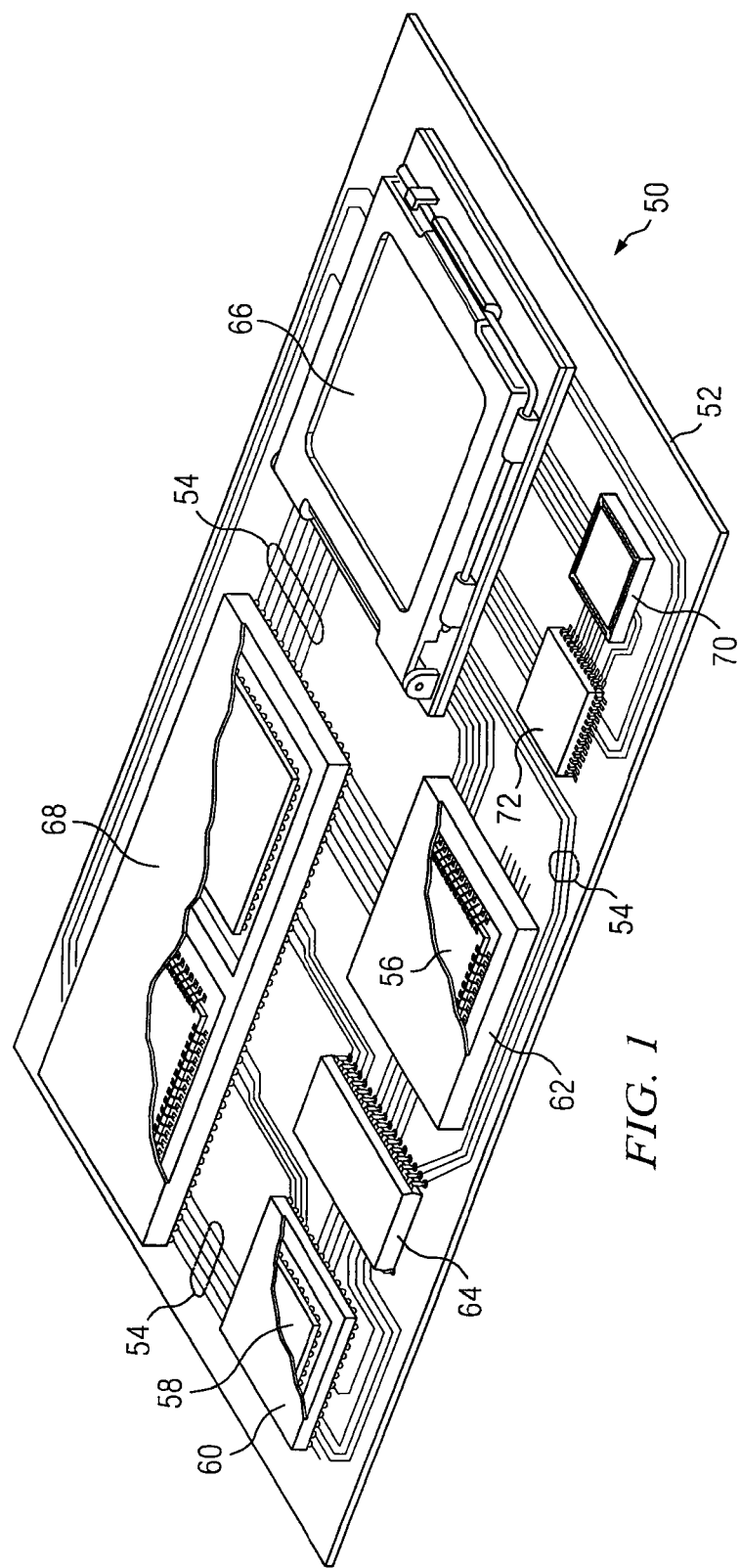
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
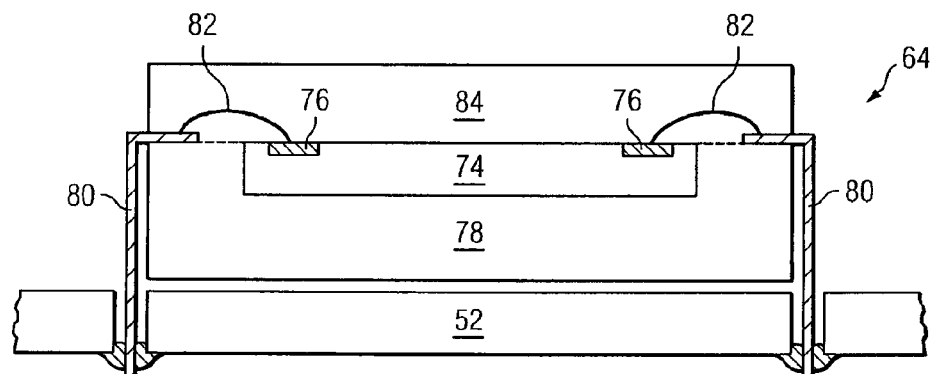
FIGS. 2a-2c illustrate further detail of the representative semiconductor packages mounted to the PCB.
Figure 2B:
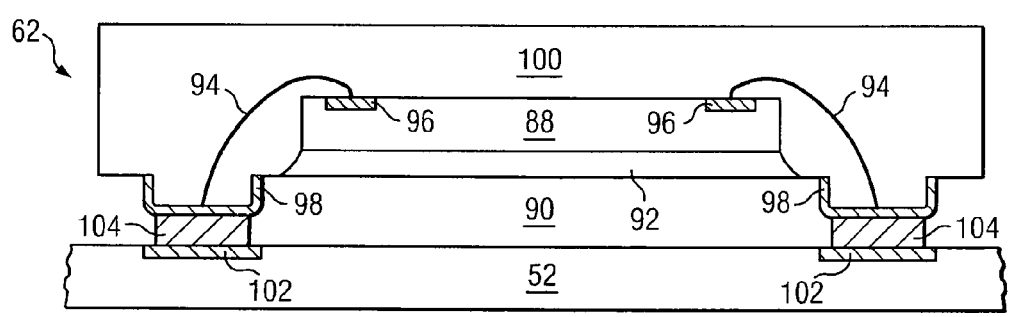
Figure 2C:
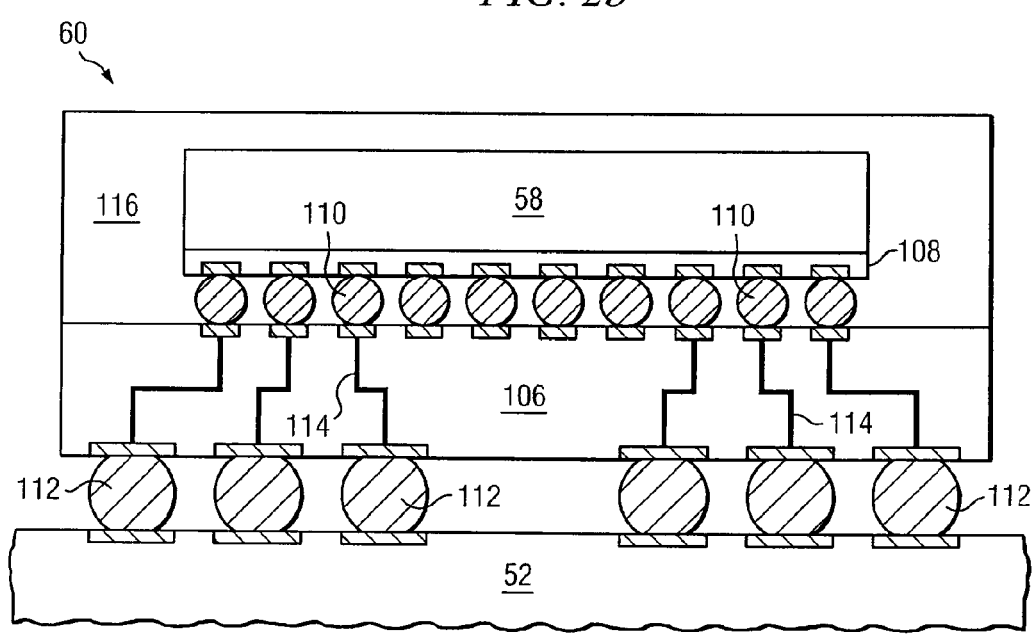

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3:
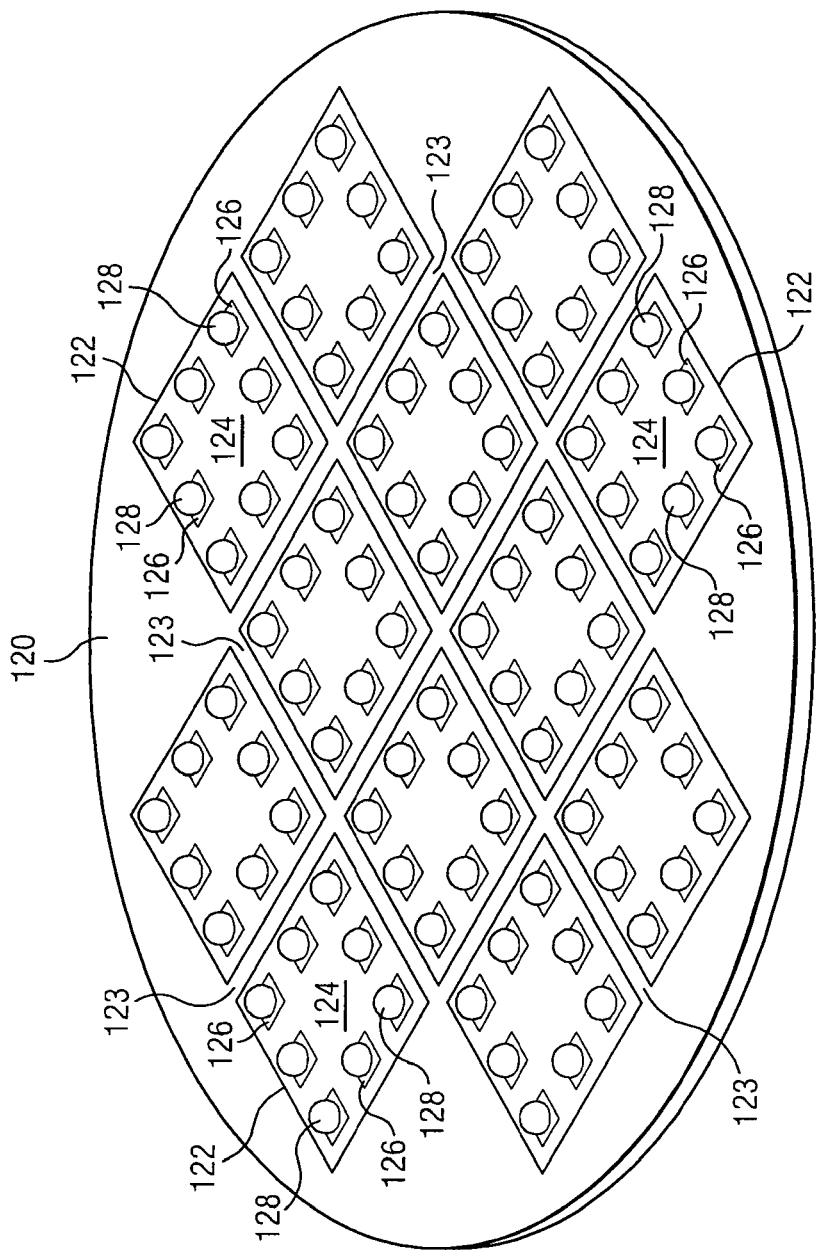
FIG. 3 illustrates a semiconductor wafer with bumped die.

FIGS. 3-10 illustrate, in relation to FIGS. 1 and 2a-2c, a process of forming adhesive material to secure a semiconductor die to a temporary carrier in a WLCSP. FIG. 3 shows a semiconductor wafer 120 with a base substrate material such as silicon, germanium, gallium arsenide, indium phosphide, or silicon carbide, for structural support. A plurality of semiconductor die or components 122 is formed on wafer 120 separated by saw streets 123 as described above. Each semiconductor die 122 has an active surface 124 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 124 to implement analog circuits or digital circuits, such as digital signal processor (DSP), ASIC, memory, or other signal processing circuit. Semiconductor die 122 may also contain IPD, such as inductors, capacitors, and resistors, for RF signal processing.

An electrically conductive bump material is deposited over contact pads 126 on active surface 124 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is ref lowed by heating the material above its melting point to form spherical balls or bumps 128. Bumps 128 represent one type of interconnect structure that can be formed over contact pads 126 on active surface 124. The interconnect structure can also use stud bump, micro bump, conductive pillar, conductive paste, or other electrical interconnect links.

In FIG. 4a, a substrate or carrier 130 contains temporary or sacrificial base material such as silicon, polymer, polymer composite, metal, ceramic, glass, glass epoxy, beryllium oxide, or other suitable low-cost, rigid material or bulk semiconductor material for structural support. An interface layer or tape 132 is applied over carrier 130 as a temporary adhesive bonding film or etch-stop layer. An adhesive layer or material 134 is deposited on carrier tape 132 by screen printing or other suitable applicator. Adhesive material 134 can be flexible plastic base film, such as polyvinyl chloride (PVC) or polyolefin, with a synthetic acrylic adhesive or ultraviolet (UV)-sensitive adhesive, for device mounting and removal. Alternatively, adhesive material 134 can be thermal epoxy, polymer composite, or inorganic bonding compounds. Adhesive material 134 is releasable by light, thermal, laser, or mechanical pressure.

In one embodiment, adhesive material 134 is formed as a continuous layer or individual islands or bumps 134a and 134b on carrier tape 132 in an area designated to mate with a central active region and/or peripheral active region of a semiconductor die to be attached to the carrier. For example, FIG. 4b shows adhesive material 134a deposited as individual islands or bumps in the area designated to mate with central active region 124a, and adhesive material 134b deposited as a continuous layer in the area designated to mate around a periphery of active region 124b, of semiconductor die 122 to be attached to carrier tape 132. Adhesive material 134b can also be deposited as individual islands or bumps in the area designated to mate around the periphery or corner of active region 124b.

In FIG. 5a, semiconductor die 122 are singulated from wafer 120 using a dicing operation along saw streets 123 and positioned for mounting over carrier tape 132 and adhesive material 134 with a pick and place operation. Semiconductor die 122 are positioned with contact pads 126 and bumps 128 oriented face down toward carrier tape 132 so that the central active region 124a is aligned with adhesive material 134a and the periphery or corner of active region 124b is aligned with adhesive material 134b.

In an alternate embodiment, as shown in FIG. 5b, adhesive material 134 is formed as individual islands or bumps on the central active region 124a and/or the periphery or corner of active region 124b of semiconductor die 122 while in wafer form, i.e., prior to the dicing operation. For example, adhesive material 134a is deposited as individual islands or bumps on the central active region 124a, and adhesive material 134b is deposited as a continuous layer around the periphery of active region 124b of semiconductor die 122. Semiconductor die 122 are then singulated from wafer 120 using a dicing operation and positioned for mounting over carrier tape 132 with a pick and place operation. Semiconductor die 122 are positioned with contact pads 126 and bumps 128 oriented face down toward carrier tape 132.

FIG. 5c shows semiconductor die 122 mounted to carrier tape 132 with the central active region 124a contacting adhesive material 134a and the periphery of active region 124b contacting adhesive material 134b.

FIG. 5d shows an embodiment without adhesive material 134b deposited around the periphery of active region 124b. In this case, semiconductor die 122 is mounted to carrier tape 132 with only adhesive material 134a contacting the central active region 124a.

Continuing with the embodiment from FIG. 5d, an encapsulant or molding compound 136 is deposited over and around semiconductor die 122 using a paste printing, compressive molding, transfer molding, liquid encapsulant molding, vacuum lamination, spin coating, or other suitable applicator, as shown in FIG. 5e. Encapsulant 136 can be polymer composite material, such as epoxy resin with filler, epoxy acrylate with filler, or polymer with proper filler. Encapsulant 136 is non-conductive and environmentally protects the semiconductor device from external elements and contaminants. Adhesive material 134 serves to retain or hold semiconductor die 122 in place to carrier tape 132 to avoid die shifting during the encapsulation process.

Figure 5F:
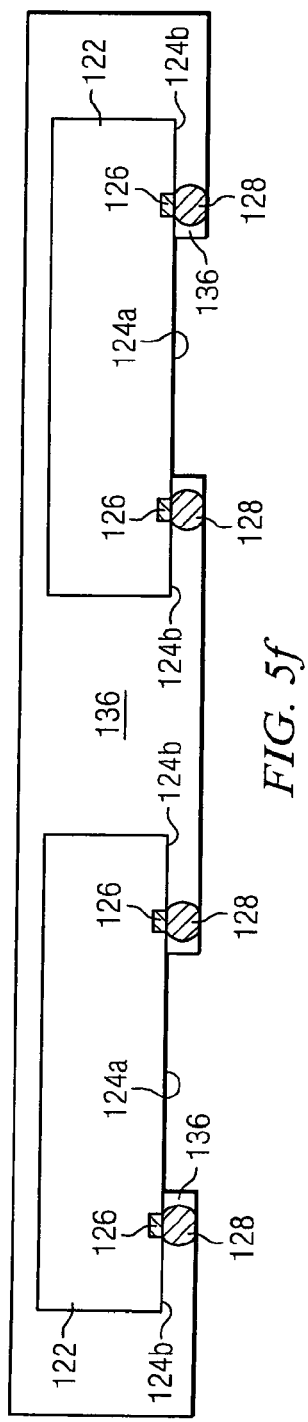

In FIG. 5f, carrier 130 and tape 132 are removed by chemical etching, mechanical peel-off, CMP, mechanical grinding, thermal bake, laser scanning, or wet stripping. Adhesive material 134 is released and removed by light, thermal, laser, or mechanical pressure.

Figure 5G:
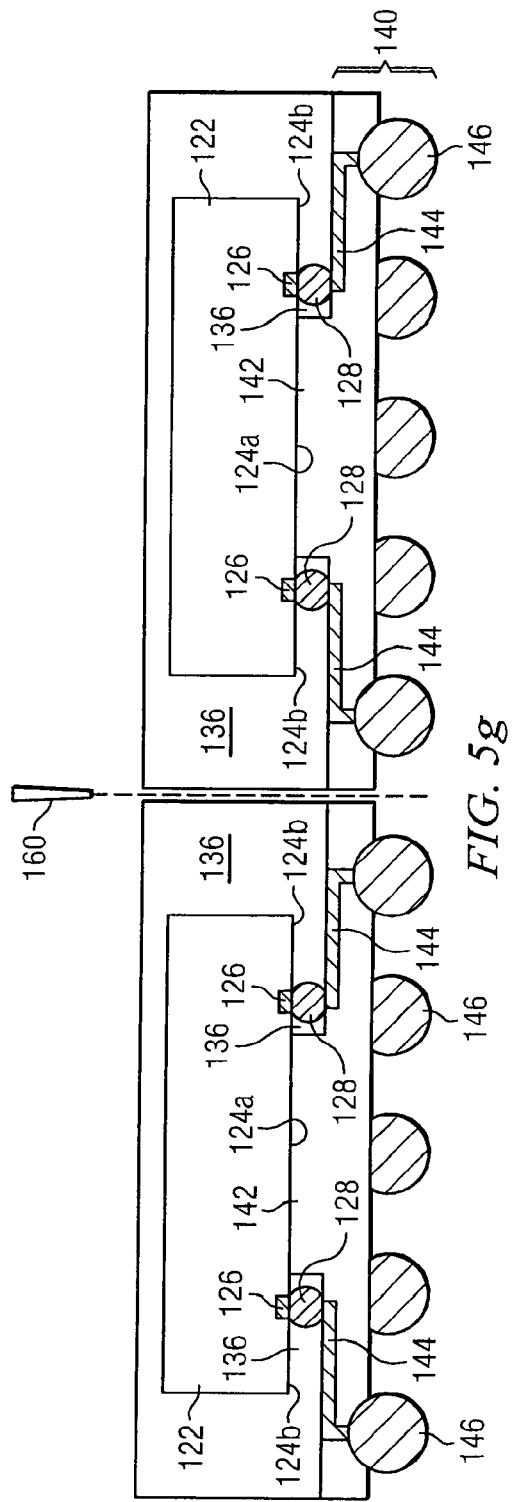

In FIG. 5g, a build-up interconnect structure 140 is formed over semiconductor die 122, bumps 128, and encapsulant 136. The build-up interconnect structure 140 includes an electrically conductive layer 144 formed in encapsulant 136 using a patterning and deposition process such as PVD, CVD, sputtering, electrolytic plating, and electroless plating. Conductive layer 144 can be one or more layers of Al, Cu, Sn, Ni, Au, Ag, or other suitable electrically conductive material. One portion of conductive layer 144 is electrically connected as a redistribution layer (RDL) to bumps 128 and contact pads 126 of semiconductor die 122. Other portions of conductive layer 144 can be electrically common or electrically isolated depending on the design and function of the semiconductor device.

The build-up interconnect structure 140 further includes an insulating or passivation layer 142 containing one or more layers of silicon dioxide (SiO2), silicon nitride (Si3N4), silicon oxynitride (SiON), tantalum pentoxide (Ta2O5), aluminum oxide (Al2O3), photoresist, or other material having similar insulating and structural properties. The insulating layer 142 is formed using PVD, CVD, printing, spin coating, spray coating, sintering or thermal oxidation.

An electrically conductive bump material is deposited over build-up interconnect structure 140 and electrically connected to conductive layer 144 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 144 using a suitable attachment or bonding process. In one embodiment, the bump material is reflowed by heating the material above its melting point to form spherical balls or bumps 146. In some applications, bumps 146 are reflowed a second time to improve electrical contact to conductive layer 144. The bumps can also be compression bonded to conductive layer 144. Bumps 146 represent one type of interconnect structure that can be formed over conductive layer 144. The interconnect structure can also use stud bump, micro bump, conductive pillar, conductive paste, or other electrical interconnect.

Figure 5H:
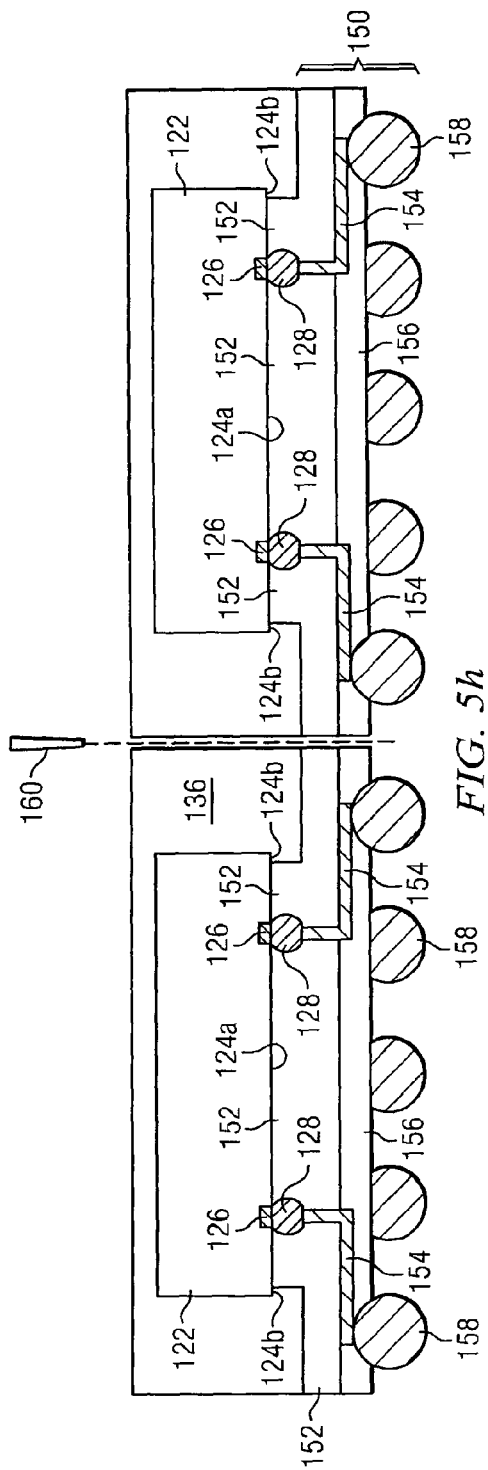

FIG. 5h shows the embodiment based on FIG. 5c, with adhesive material 134a and 134b removed from active region 124. In this case, a build-up interconnect structure 150 is formed over semiconductor die 122, bumps 128, and encapsulant 136. The build-up interconnect structure 150 includes an insulating or passivation layer 152 containing one or more layers of SiO2, Si3N4, SiON, Ta2O5, Al2O3, photoresist, or other material having similar insulating and structural properties. The insulating layer 152 is formed using PVD, CVD, printing, spin coating, spray coating, sintering or thermal oxidation.

An electrically conductive layer 154 formed over insulating layer 152 using a patterning and deposition process such as PVD, CVD, sputtering, electrolytic plating, and electroless plating. Conductive layer 154 can be one or more layers of Al, Cu, Sn, Ni, Au, Ag, or other suitable electrically conductive material. One portion of conductive layer 154 is electrically connected as an RDL to bumps 128 and contact pads 126 of semiconductor die 122. Other portions of conductive layer 154 can be electrically common or electrically isolated depending on the design and function of the semiconductor device.

An insulating or passivation layer 156 is formed over insulating layer 152 and conductive layer 154 with one or more layers of SiO2, Si3N4, SiON, Ta2O5, Al2O3, photoresist, or other material having similar insulating and structural properties. The insulating layer 156 is formed using PVD, CVD, printing, spin coating, spray coating, sintering or thermal oxidation.

An electrically conductive bump material is deposited over build-up interconnect structure 150 and electrically connected to conductive layer 154 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 154 using a suitable attachment or bonding process. In one embodiment, the bump material is reflowed by heating the material above its melting point to form spherical balls or bumps 158. In some applications, bumps 158 are reflowed a second time to improve electrical contact to conductive layer 154. The bumps can also be compression bonded to conductive layer 154. Bumps 158 represent one type of interconnect structure that can be formed over conductive layer 154. The interconnect structure can also use stud bump, micro bump, conductive pillar, conductive paste, or other electrical interconnect.

Figure 6:
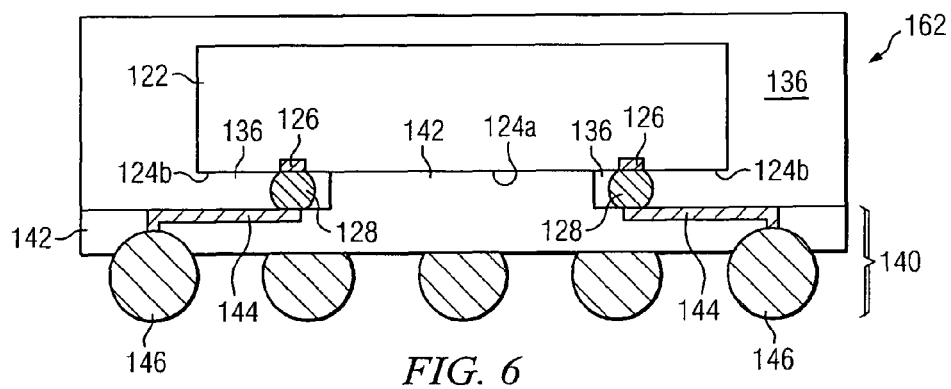
FIG. 6 illustrates the semiconductor die in the WLCSP with a first build-up interconnect structure.
Figure 7:
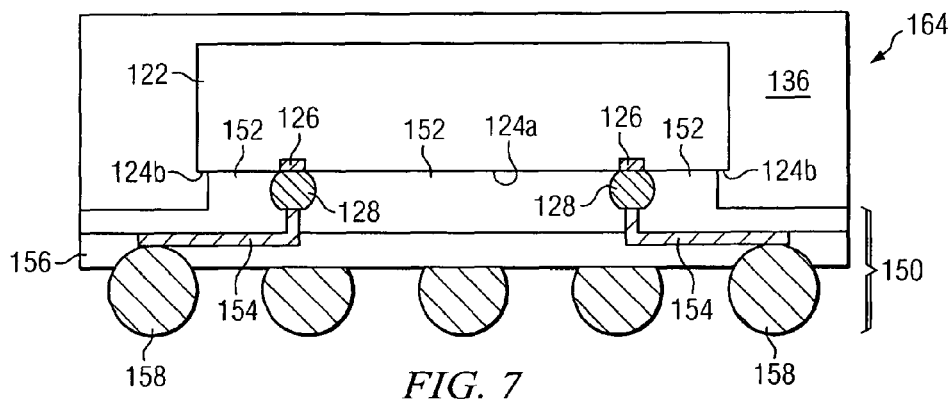
FIG. 7 illustrates the semiconductor die in the WLCSP with a second build-up interconnect structure.

Semiconductor die 122 are singulated with saw blade or laser cutting device 160 into individual WLCSP. FIG. 6 shows WLCSP 162 from FIG. 5g after singulation; FIG. 7 shows WLCSP 164 from FIG. 5h after singulation. Contact pads 126 of semiconductor die 122 are electrically connected through bumps 128 to build-up interconnect structure 140 or 150. The adhesive material 134 provides a secure bond between semiconductor die 122 and carrier tape 132 to prevent shifting of the die during encapsulant deposition or mold flow process described in FIG. 5e. RDLs 144 and 154 can be formed more accurately. Bumps 128 are formed on semiconductor die 122 (bumped die) while in wafer form. Accordingly, there is no need to provide wettable contact pads or reflow bump material post wafer singulation, which saves manufacturing cost and time.

Figure 8:
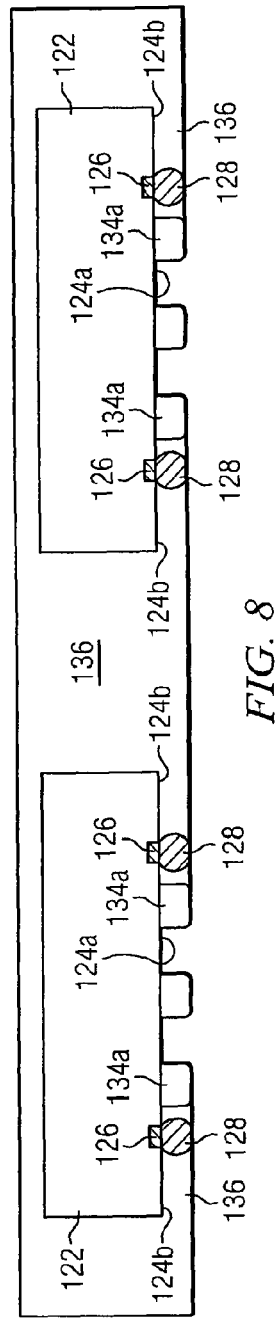
FIG. 8 illustrates an alternate process leaving the adhesive material on the semiconductor die.
Figure 9:
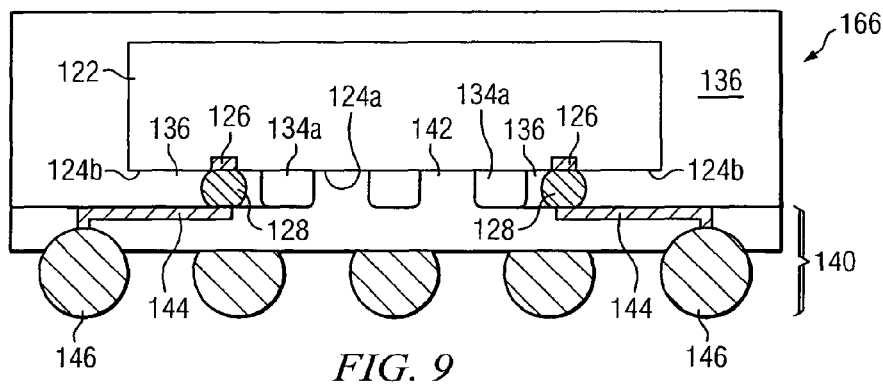
FIG. 9 illustrates the WLCSP with adhesive material remaining between the semiconductor die and first build-up interconnect structure.
Figure 10:
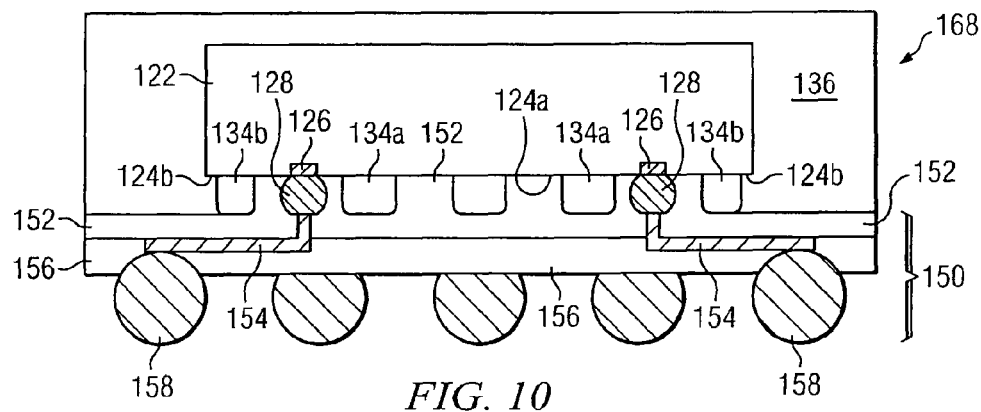
FIG. 10 illustrates the WLCSP with adhesive material remaining between the semiconductor die and second build-up interconnect structure.

In a variation of the above process, after FIG. 5e, carrier 130 and tape 132 are removed by chemical etching, mechanical peel-off, CMP, mechanical grinding, thermal bake, laser scanning, or wet stripping. Adhesive material 134 remains in place, as shown in FIG. 8. Adhesive material 134 can be cured to harden the material. The build-up interconnect structure 140 or 150 is formed over semiconductor die 122, bumps 128, adhesive material 134, and encapsulant 136, similar to FIGS. 5g and 5h. Semiconductor die 122 are singulated with the saw blade or laser cutting device into individual WLCSP. FIG. 9 shows WLCSP 166 from FIG. 5g after singulation; FIG. 10 shows WLCSP 168 from FIG. 5h after singulation. Contact pads 126 of semiconductor die 122 are electrically connected through bumps 128 to build-up interconnect structure 140. The adhesive material 134 provides a secure bond between semiconductor die 122 and carrier tape 132 to prevent shifting of the die during encapsulant deposition or mold flow process described in FIG. 5e. RDLs 144 and 154 can be formed more accurately. Adhesive material 134 also acts as a thermal stress buffer against any mismatch in the coefficient of thermal expansion (CTE) between semiconductor die 122 and build-up interconnect structure 140 or 150. Bumps 128 are formed on semiconductor die 122 (bumped die) while in wafer form. Accordingly, there is no need to provide wettable contact pads or reflow bump material post wafer singulation, which saves manufacturing cost and time.

In another embodiment, semiconductor wafer 120 is provided with semiconductor die 122, as described in FIG. 3. In FIG. 11a, a substrate or carrier 170 contains temporary or sacrificial base material such as silicon, polymer, polymer composite, metal, ceramic, glass, glass epoxy, beryllium oxide, or other suitable low-cost, rigid material or bulk semiconductor material for structural support. An interface layer or tape 172 is applied over carrier 170 as a temporary adhesive bonding film or etch-stop layer. An adhesive layer or material 174 is deposited on carrier tape 172 by screen printing or other suitable applicator. Adhesive material 174 can be flexible plastic base film, such as PVC or polyolefin, with a synthetic acrylic adhesive or UV-sensitive adhesive, for device mounting and removal. Alternatively, adhesive material 174 can be thermal epoxy, polymer composite, or inorganic bonding compounds. Adhesive material 174 is releasable by light, thermal, laser, or mechanical pressure.

In this embodiment, adhesive material 174 is deposited as a continuous layer over an area of the carrier tape designated to mate with the active region of a semiconductor die to be attached to the carrier. For example, adhesive material 174 is deposited as a continuous layer over the area of carrier tape 172 designated to mate with active region 124 of semiconductor die 122 to be attached to carrier tape 172.

In an alternate embodiment, adhesive material 174 is formed as a continuous layer over active region 124 of semiconductor die 122 while in wafer form, i.e., prior to the dicing operation. Semiconductor die 122 are then singulated from wafer 120 using a dicing operation and positioned for mounting over carrier tape 172 with a pick and place operation, as shown in FIG. 11b. Semiconductor die 122 are positioned with contact pads 126 and bumps 128 oriented face down toward carrier tape 172.

FIG. 11c shows semiconductor die 122 mounted to carrier tape 172 with active region 124 contacting adhesive material 174. An encapsulant or molding compound 176 is deposited over and around semiconductor die 122 using a paste printing, compressive molding, transfer molding, liquid encapsulant molding, vacuum lamination, spin coating, or other suitable applicator. Encapsulant 176 can be polymer composite material, such as epoxy resin with filler, epoxy acrylate with filler, or polymer with proper filler. Encapsulant 176 is non-conductive and environmentally protects the semiconductor device from external elements and contaminants. Adhesive material 174 serves to retain or hold semiconductor die 122 in place to carrier tape 172 to avoid die shifting during the encapsulation process.

In FIG. 11d, carrier 170 and tape 172 are removed by chemical etching, mechanical peel-off, CMP, mechanical grinding, thermal bake, laser scanning, or wet stripping. Adhesive material 174 is released and removed by light, thermal, laser, or mechanical pressure.

In FIG. 11e, a build-up interconnect structure 180 is formed over semiconductor die 122, bumps 128, and encapsulant 176. The build-up interconnect structure 180 includes an insulating or passivation layer 182 containing one or more layers of SiO2, Si3N4, SiON, Ta2O5, Al2O3, photoresist, or other material having similar insulating and structural properties. The insulating layer 182 is formed using PVD, CVD, printing, spin coating, spray coating, sintering or thermal oxidation.

The build-up interconnect structure 180 further includes an electrically conductive layer 184 formed over insulating layer 182 using a patterning and deposition process such as PVD, CVD, sputtering, electrolytic plating, and electroless plating. Conductive layer 184 can be one or more layers of Al, Cu, Sn, Ni, Au, Ag, or other suitable electrically conductive material. One portion of conductive layer 184 is electrically connected as an RDL to bumps 128 and contact pads 126 of semiconductor die 122. Other portions of conductive layer 184 can be electrically common or electrically isolated depending on the design and function of the semiconductor device.

An insulating or passivation layer 186 is formed over insulating layer 182 and conductive layer 184 with one or more layers of SiO2, Si3N4, SiON, Ta2O5, Al2O3, photoresist, or other material having similar insulating and structural properties. The insulating layer 186 is formed using PVD, CVD, printing, spin coating, spray coating, sintering or thermal oxidation.

An electrically conductive bump material is deposited over build-up interconnect structure 180 and electrically connected to conductive layer 184 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 184 using a suitable attachment or bonding process. In one embodiment, the bump material is reflowed by heating the material above its melting point to form spherical balls or bumps 188. In some applications, bumps 188 are reflowed a second time to improve electrical contact to conductive layer 184. The bumps can also be compression bonded to conductive layer 184. Bumps 188 represent one type of interconnect structure that can be formed over conductive layer 184. The interconnect structure can also use stud bump, micro bump, conductive pillar, conductive paste, or other electrical interconnect.

Figure 11F:
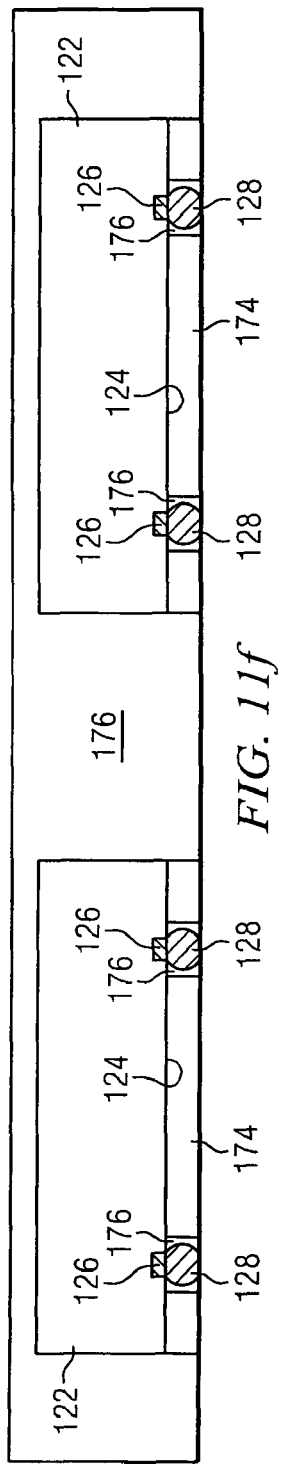
Figure 11G:
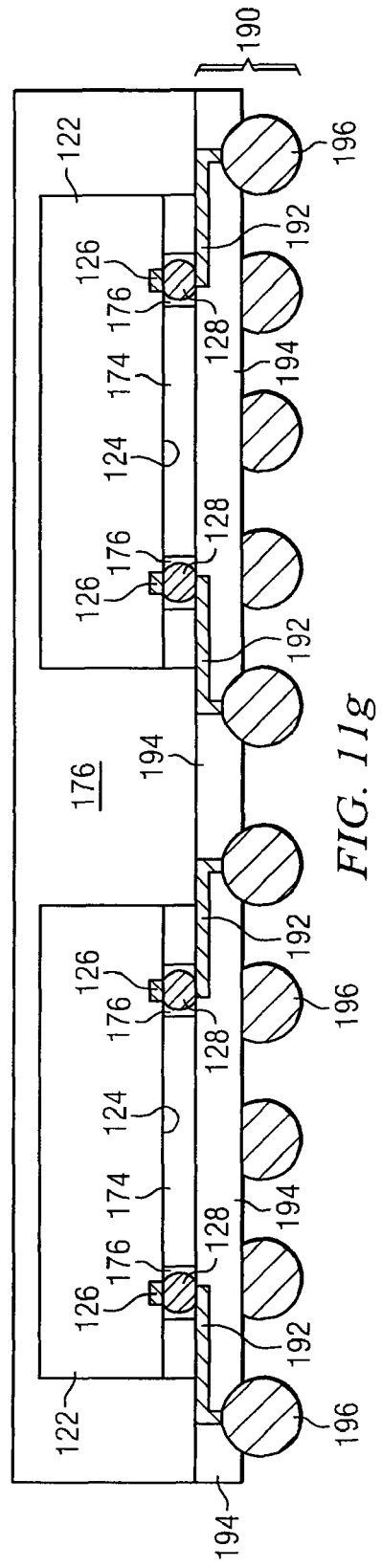

FIG. 11f shows an embodiment with adhesive material 174 remaining in place after removal of the carrier and tape. In FIG. 11g, a build-up interconnect structure 190 is formed over semiconductor die 122, bumps 128, adhesive material 174, and encapsulant 176. The build-up interconnect structure 190 includes an electrically conductive layer 192 formed using a patterning and deposition process such as PVD, CVD, sputtering, electrolytic plating, and electroless plating. Conductive layer 192 can be one or more layers of Al, Cu, Sn, Ni, Au, Ag, or other suitable electrically conductive material. One portion of conductive layer 192 is electrically connected as an RDL to bumps 128 and contact pads 126 of semiconductor die 122. Other portions of conductive layer 192 can be electrically common or electrically isolated depending on the design and function of the semiconductor device.

An insulating or passivation layer 194 is formed over adhesive material 174 and encapsulant 176 with one or more layers of SiO2, Si3N4, SiON, Ta2O5, Al2O3, photoresist, or other material having similar insulating and structural properties. The insulating layer 194 is formed using PVD, CVD, printing, spin coating, spray coating, sintering or thermal oxidation.

An electrically conductive bump material is deposited over build-up interconnect structure 190 and electrically connected to conductive layer 192 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 192 using a suitable attachment or bonding process. In one embodiment, the bump material is reflowed by heating the material above its melting point to form spherical balls or bumps 196. In some applications, bumps 196 are reflowed a second time to improve electrical contact to conductive layer 192. The bumps can also be compression bonded to conductive layer 192. Bumps 196 represent one type of interconnect structure that can be formed over conductive layer 192. The interconnect structure can also use stud bump, micro bump, conductive pillar, conductive paste, or other electrical interconnect.

Figure 12:
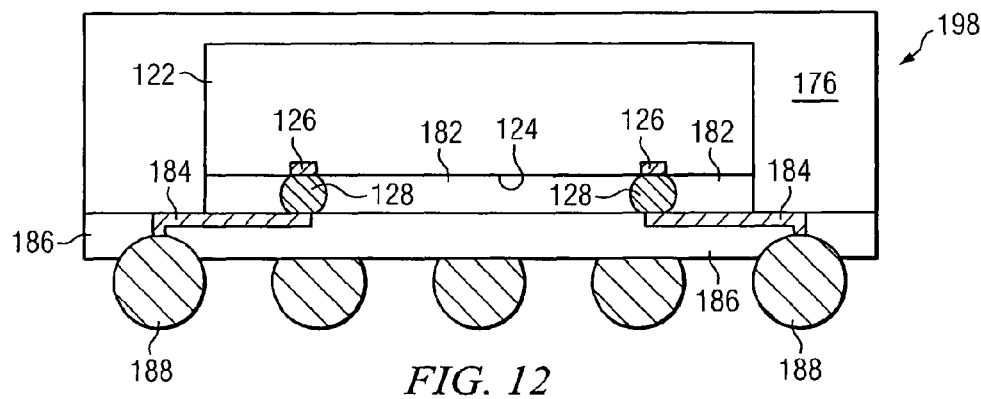
FIG. 12 illustrates the WLCSP without adhesive material between the semiconductor die and build-up interconnect structure.
Figure 13:
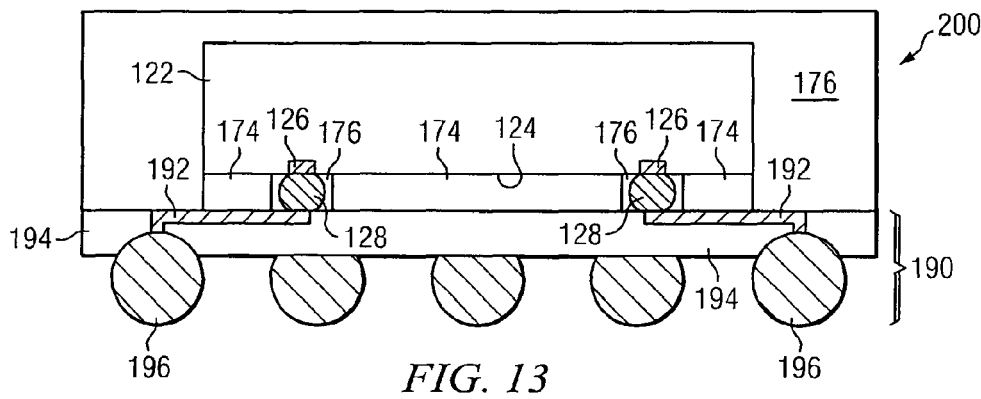
FIG. 13 illustrates the WLCSP with adhesive material remaining between the semiconductor die and build-up interconnect structure.

Semiconductor die 122 are singulated with a saw blade or laser cutting device into individual WLCSP. FIG. 12 shows WLCSP 198 from FIG. 11e after singulation; FIG. 13 shows WLCSP 200 from FIG. 11g after singulation. Contact pads 126 of semiconductor die 122 are electrically connected through bumps 128 to build-up interconnect structure 180 or 190. The adhesive material 174 provides a secure bond between semiconductor die 122 and carrier tape 172 to prevent shifting of the die during encapsulant deposition or mold flow process described in 118c. RDLs 184 and 192 can be formed more accurately. Bumps 128 are formed on semiconductor die 122 (bumped die) while in wafer form. Accordingly, there is no need to provide wettable contact pads or reflow bump material post wafer singulation, which saves manufacturing cost and time.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of making a semiconductor device, comprising:
    providing a carrier;
    providing a semiconductor die including a plurality of first bumps formed over a surface of the semiconductor die;
    depositing an adhesive material as a plurality of islands or second bumps over the carrier or surface of the semiconductor die;
    disposing the semiconductor die over the carrier and adhesive material;

depositing an encapsulant over the semiconductor die and carrier while the adhesive material holds the semiconductor die in place to the carrier;

removing the carrier; and forming an interconnect structure over the surface of the semiconductor die, the interconnect structure being electrically connected to the plurality of first bumps of the semiconductor die.

2. The method of claim 1, further including removing the adhesive material prior to forming the interconnect structure.

3. The method of claim 1, further including forming the interconnect structure over the adhesive material and the surface of the semiconductor die.

4. The method of claim 1, wherein forming the interconnect structure includes:

forming a first insulating layer;

forming a conductive layer over the first insulating layer;

forming a second insulating layer over the conductive layer; and forming a plurality of third bumps over the conductive layer.

5. The method of claim 1, wherein forming the interconnect structure includes:

forming an insulating layer;

forming a conductive layer over the insulating layer; and forming a plurality of third bumps over the conductive layer.

6. The method of claim 1, further including depositing the adhesive material in a central region of the semiconductor die.

7. The method of claim 1, further including depositing the adhesive material in a peripheral or corner region of the semiconductor die.

8. A method of making a semiconductor device, comprising:

providing a carrier;

providing a semiconductor component;

depositing an adhesive material as a plurality of islands or first bumps over the carrier or a surface of the semiconductor component;

disposing the semiconductor component over the carrier;

depositing an encapsulant over the semiconductor component and carrier while the adhesive material holds the semiconductor component in place to the carrier;

removing the carrier; and forming an interconnect structure over the surface of the semiconductor component.

9. The method of claim 8, further including removing the adhesive material prior to forming the interconnect structure.

10. The method of claim 8, further including forming the interconnect structure over the adhesive material and the surface of the semiconductor component.

11. The method of claim 8, wherein forming the interconnect structure includes:

forming a first insulating layer;

forming a conductive layer over the first insulating layer;

forming a second insulating layer over the conductive layer; and forming a plurality of second bumps over the conductive layer.

12. The method of claim 8, wherein forming the interconnect structure includes:

forming an insulating layer;

forming a conductive layer over the insulating layer; and forming a plurality of second bumps over the conductive layer.

13. The method of claim 8, further including depositing the adhesive material in a central region of the semiconductor component.

14. The method of claim 8, further including depositing the adhesive material in a peripheral or corner region of the semiconductor component.

15. A method of making a semiconductor device, comprising:

providing a carrier including an interface layer;

providing a semiconductor component including a plurality of bumps;

depositing an adhesive material over the carrier or semiconductor component;

disposing the semiconductor component over the carrier;

depositing an encapsulant over the semiconductor component while the adhesive material holds the semiconductor component in place over the carrier; and removing the adhesive material.

16. The method of claim 15, further including depositing the adhesive material as a plurality of islands or bumps over the carrier or semiconductor component.

17. The method of claim 15, further including depositing the adhesive material as a continuous layer over the carrier or semiconductor component.

18. The method of claim 15, further including forming an interconnect structure under the semiconductor component.

19. A method of making a semiconductor device, comprising:

providing a carrier;

providing a semiconductor component including a plurality of bumps;

depositing an adhesive material over the carrier or semiconductor component;

disposing the semiconductor component over the carrier with the adhesive material around the bumps and between the carrier and semiconductor component; and removing the adhesive material.

20. The method of claim 19, further including depositing the adhesive material as a plurality of islands or bumps over the carrier or semiconductor component.

21. The method of claim 19, further including depositing the adhesive material in a central region or peripheral or corner region of the semiconductor component.

22. The method of claim 19, further including depositing the adhesive material as a continuous layer over the carrier or semiconductor component.

23. The method of claim 19, further including forming an interconnect structure under the and semiconductor component.

24. A method of making a semiconductor device, comprising:

providing a semiconductor die;

providing a carrier including an interface layer;

depositing an adhesive material as a plurality of islands or bumps over the interface layer or semiconductor die; and disposing the semiconductor die over the interface layer with the adhesive material bonding the semiconductor die and interface layer.

25. The method of claim 24, further including depositing the adhesive material in a peripheral region of the semiconductor die.

26. The method of claim 24, further including depositing the adhesive material between the semiconductor die and carrier.

* * * * *